(12) United States Patent
Rius

(10) Patent No.: US 7,887,891 B2
(45) Date of Patent: Feb. 15, 2011

(54) APPARATUS FOR PLASMA-ENHANCED CHEMICAL VAPOR DEPOSITION (PECVD) OF AN INTERNAL BARRIER LAYER INSIDE A CONTAINER, SAID APPARATUS INCLUDING A GAS LINE ISOLATED BY A SOLENOID VALVE

(75) Inventor: Jean-Michel Rius, Octeville-sur-Mer (FR)

(73) Assignee: Sidel Participations, Octeville-sur-Mer (FR)

(*) Notice: Subject to any disclaimer, the term of this patent is extended or adjusted under 35 U.S.C. 154(b) by 579 days.

(21) Appl. No.: 11/996,204

(22) PCT Filed: Jul. 24, 2006

(86) PCT No.: PCT/FR2006/001803

§ 371 (c)(1),
(2), (4) Date: Jan. 18, 2008

(87) PCT Pub. No.: WO2007/012744

PCT Pub. Date: Feb. 1, 2007

(65) Prior Publication Data

US 2008/0206477 A1  Aug. 28, 2008

(30) Foreign Application Priority Data

Jul. 26, 2005 (FR) .................................. 05 07966

(51) Int. Cl.
    *H05H 1/24* (2006.01)
(52) U.S. Cl. .................. 427/578; 427/569; 427/230; 427/237; 427/238

(58) Field of Classification Search .................. 427/569, 427/578, 230, 237
See application file for complete search history.

(56) References Cited

U.S. PATENT DOCUMENTS

| | | | | |
|---|---|---|---|---|
| 4,439,463 | A * | 3/1984 | Miller | 427/563 |
| 4,656,083 | A * | 4/1987 | Hoffman et al. | 442/123 |
| 6,180,191 | B1 * | 1/2001 | Felts | 427/569 |
| 6,421,127 | B1 * | 7/2002 | McAndrew et al. | 356/437 |
| 6,924,001 | B2 * | 8/2005 | Hama et al. | 427/237 |
| 7,603,962 | B2 * | 10/2009 | Hama et al. | 118/723 E |
| 7,754,302 | B2 * | 7/2010 | Yamasaki et al. | 428/35.7 |
| 2004/0170783 | A1 | 9/2004 | Forriere et al. | |

FOREIGN PATENT DOCUMENTS

DE  3521625 A1  12/1986

(Continued)

*Primary Examiner*—David Turocy
(74) *Attorney, Agent, or Firm*—Sughrue Mion, PLLC

(57) ABSTRACT

A machine (1) for depositing a thin layer of a barrier-effect material inside a container (2) by plasma-enhanced chemical vapor deposition, said machine (1) comprising: a processing unit (4) receiving the container (2) and equipped with an electromagnetic wave generator (11); a precursor gas outlet (17); an injector (13) for injecting said precursor gas into the container (2), said injector (13) having a bottom end (14) that opens out into the container (2) and an opposite top end (15); a precursor gas feed duct (20) that puts the precursor gas outlet (17) into fluid flow connection with the top end (15) of the injector (13); and a solenoid valve (25) interposed in the feed duct (20) between the precursor gas outlet (17) and the injector (13), immediately upstream from the top end (15) of the injector (13).

5 Claims, 4 Drawing Sheets

FOREIGN PATENT DOCUMENTS

| | | |
|---|---|---|
| DE | 4316349 A1 | 11/1994 |
| EP | 0778089 A1 | 6/1997 |
| JP | 2002121667 A * | 4/2002 |
| WO | 9949991 A1 | 10/1999 |

* cited by examiner

APPARATUS FOR PLASMA-ENHANCED CHEMICAL VAPOR DEPOSITION (PECVD) OF AN INTERNAL BARRIER LAYER INSIDE A CONTAINER, SAID APPARATUS INCLUDING A GAS LINE ISOLATED BY A SOLENOID VALVE

TECHNICAL FIELD

The invention relates to manufacturing containers, and more particularly to manufacturing containers that are made of a polymer (e.g. made of polyethylene terephthalate (PET)), the inside wall of each container being coated with a layer of a barrier-effect material.

BACKGROUND OF THE INVENTION

Such a layer, e.g. a layer of hydrogenated amorphous carbon, of the hard type (Diamond-Like Carbon (DLC)) or of the soft type (Polymer-Like Carbon (PLC)) is conventionally formed by Plasma-Enhanced Chemical Vapor Deposition (PECVD). This technology is well explained in the Applicant's European Patent No EP 1 068 032.

For example, when a soft carbon (PLC) is implemented, the preferably used precursor gas is acetylene ($C_2H_2$). This gas is injected into the container, inside which a partial vacuum (about 0.1 millibars (mbar)) has been formed, and then the plasma is activated, i.e. the acetylene is caused to go into a cold plasma state, by means of a Ultra-High-Frequency (UHF, (2.45 gigahertz (GHz))) low-power electromagnetic excitation. Among the species that are generated, there is to be found hydrogenated carbon (with CH, $CH_2$ and $CH_3$ bonds) which is deposited in a thin layer (of a thickness of about 1600 angstroms) on the polymer substrate formed by the inside wall of the container.

This method is conventionally conducted in a machine comprising:
- a processing unit receiving the container and equipped with an electromagnetic wave generator for activating the plasma from a precursor gas;
- a precursor gas inlet;
- an injector for injecting said precursor gas into the container, said injector having a bottom end that opens out into the container and an opposite top end; and
- a precursor gas feed duct that puts the precursor gas inlet into fluid flow connection with the top end of the injector.

According to the method shown in FIG. 1, which is a graph showing how the pressure inside the container varies over time:
- the container, as formed previously by blowing or by stretch-blowing, is mounted on a moving top portion of the processing unit, and then the unit is closed, the top portion coming to rest in leaktight manner on a bottom portion including an enclosure that receives the container;
- by means of a vacuum pump, a partial vacuum is formed inside the container, for a length of time $t_0$ of several seconds (approximately in the range 1 second (s) to 2 s);
- the inside of the container is then swept with the precursor gas for a time $t_1$ of about 1 s, the effect of this sweeping being to fill the container with precursor gas while also expelling the air still present (in FIG. 1, "O" is used for "open" and "C" for "closed");
- the plasma is then activated by bombardment with microwaves, for a time $t_2$ varying in the range 1 s to 2 s, or even better in the range 1 s to 3 s, depending on the thickness of the internal barrier layer that is intended to be obtained (in a container designed for receiving a carbonated beverage such as beer, the time $t_2$ is in the range 2 s to 3 s; for still beverages such as tea, said time $t_2$ is approximately in the range 1 s to 1.5 s);
- the residual gases coming from the plasma are then removed for a time $t_3$ of about 0.1 s; and
- finally, the container is removed from the processing unit.

The processing of the container, comprising all of the above-described steps, takes several seconds (this length of time is assumed to be the sum of the times $t_0$ to $t_3$ plus the times taken to load and to unload the container), and is practically in the range 5 s to 7 s.

There is a perpetual need to increase the work rates. Unfortunately, today, it appears difficult to achieve any reduction in the times $t_0$ to $t_3$ or in the loading and unloading times.

However, the inventors do have a solution for reducing at least the time $t_1$.

It should be noted, at this stage, that the amount of gas injected into the container is conventionally controlled by a pressure regulator (also acting as a flow meter) placed between the precursor gas inlet and the feed duct.

SUMMARY OF THE INVENTION

The invention provides a machine of the above-mentioned type for depositing a thin layer of a barrier-effect material on an inside wall of a container by plasma-enhanced chemical vapor deposition, which machine further comprises: a solenoid valve interposed in the precursor gas feed duct, immediately upstream from the top end of the injector, said solenoid valve having an open configuration in which it allows the precursor gas to pass through from the feed duct to the injector, and a closed configuration in which it prevents the precursor gas from passing through.

The invention also provides a method of depositing a thin layer of a barrier-effect material on an inside wall of a container by plasma-enhanced chemical vapor deposition, said method implementing a machine as provided above, and said method comprising the following steps:
- inserting the previously formed container into the processing unit, the solenoid valve being in its closed configuration;
- putting the container under a partial vacuum;
- opening the solenoid valve and sweeping the container with the precursor gas;
- bombarding the precursor gas with electromagnetic microwaves so as to activate the plasma;
- closing the solenoid valve;
- ceasing the bombardment; and
- sucking out the residual gases coming from the plasma.

The inventors have observed the following phenomenon in machines and methods of the known type. After the residual gases coming from the plasma have been removed, when the container is separated from the processing unit, the feed duct comes into communication with the surrounding air. It is then emptied of its pressurized precursor gas and filled with air at atmospheric pressure. In view of the length of the feed duct (approximately in the range 1 meter (m) to 2 m), said feed duct stores a volume of air that must be pumped out when evacuating the container, in addition to the air present in said container, which has a negative impact on the time $t_0$ and also on the quality of deposition. In addition, while the precursor gas is being injected into the container, said precursor gas must travel along the feed duct before it reaches the container and serves to sweep said container, which has a negative impact on the time $t_1$.

In accordance with the invention, by means of the presence of the solenoid valve immediately upstream from the injector, the volume of air that needs to be expelled on injecting the precursor gas is reduced considerably. The solenoid valve, which is in the closed position while the container is being removed, limits the amount of air that flows back up into the injector by isolating the feed duct, which is still filled with pressurized precursor gas. It is thus possible to reduce the time $t_1$ to a few tenths of a second (in practice in the range 0.2 s to 0.3 s), in addition to reducing the time $t_0$ a little.

BRIEF DESCRIPTION OF THE DRAWINGS

Other objects and advantages of the invention appear from the following description given with reference to the accompanying drawings, in which.

DESCRIPTION OF THE PREFERRED EMBODIMENT OF THE INVENTION

Figure 3:
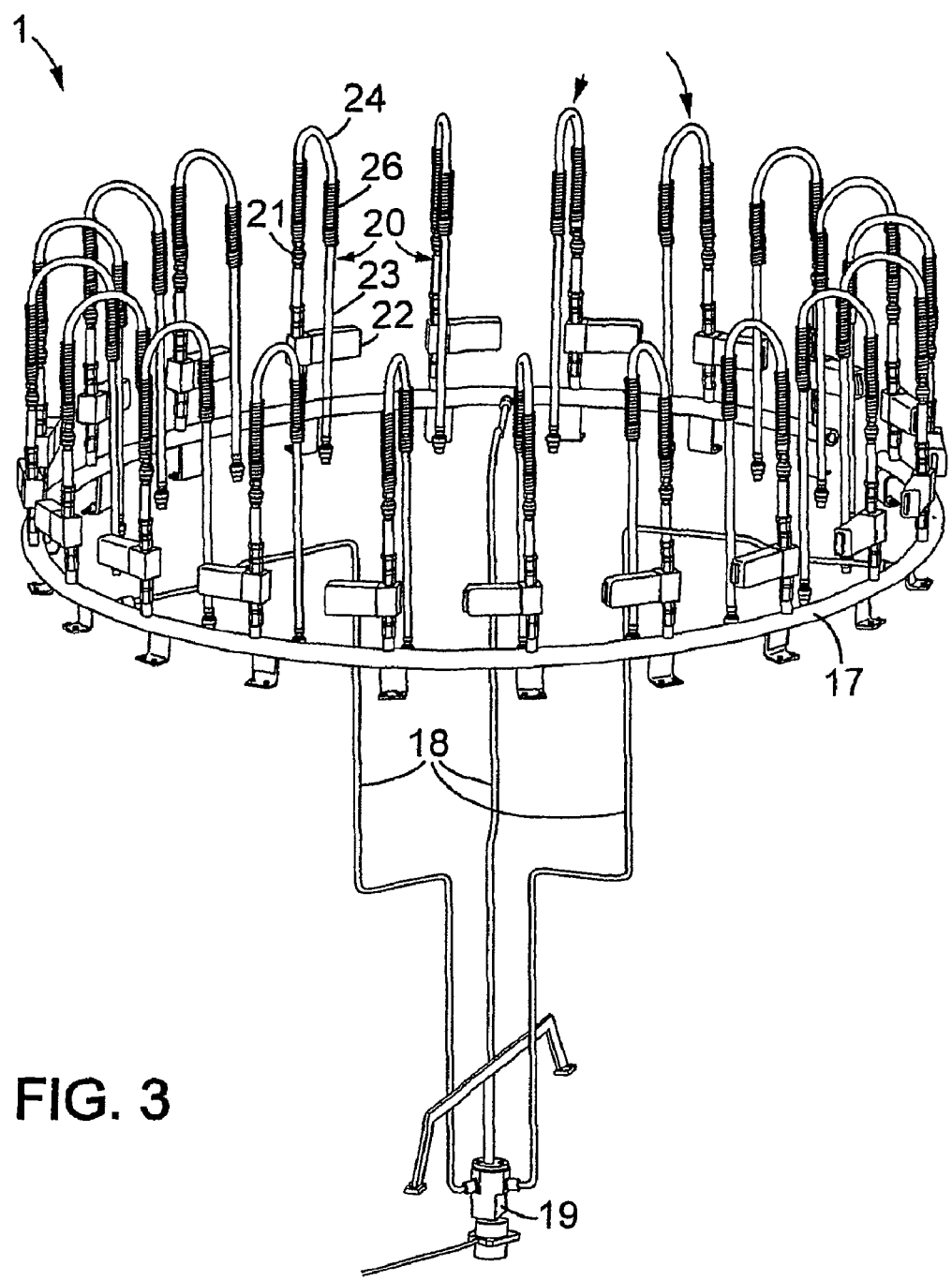
FIG. 3 is a fragmentary perspective view of the overall structure of a PECVD machine.
Figure 4:
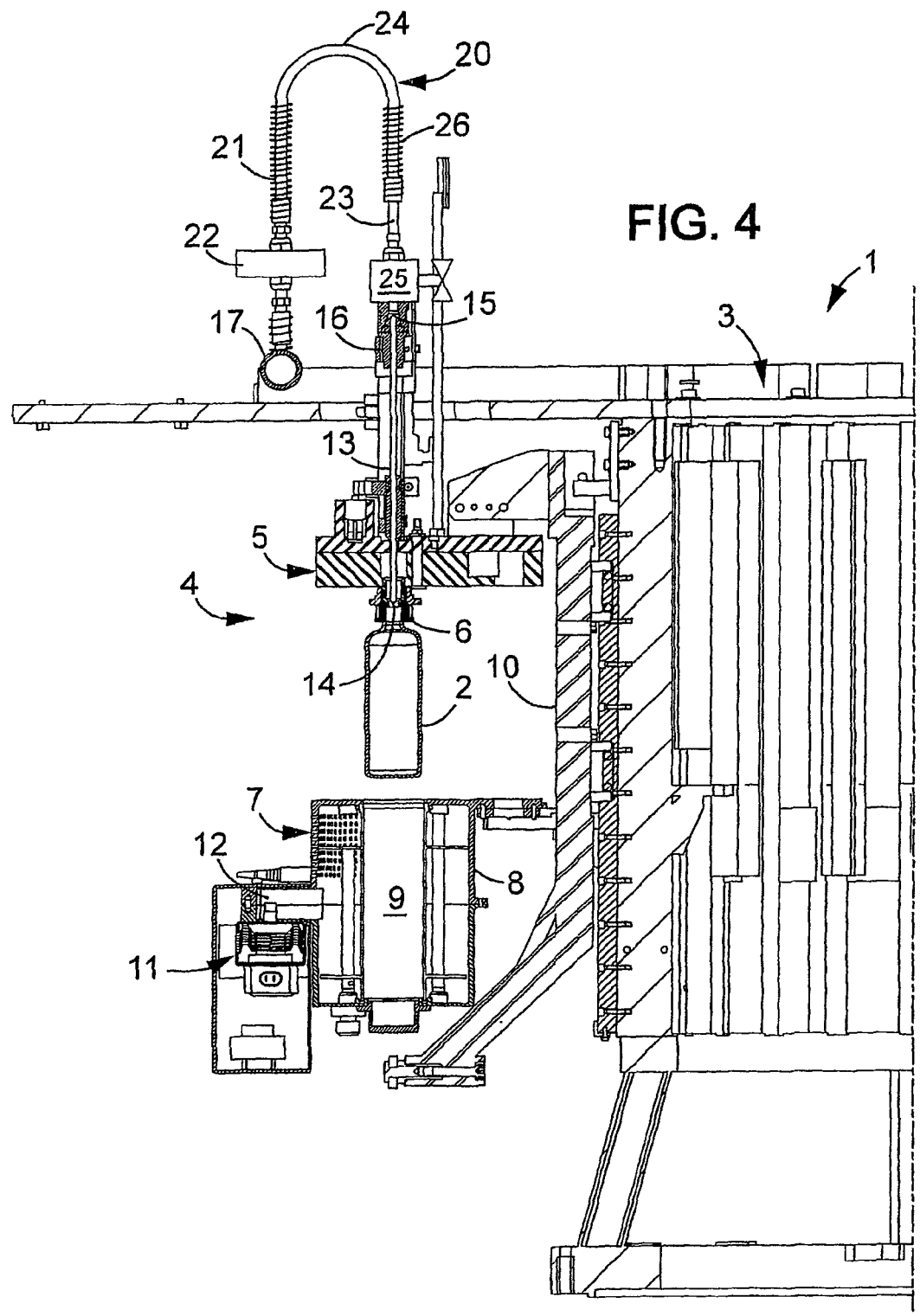
FIG. 4 is an elevation view in section showing a machine of the invention, in an "open" first position, in which a container is suspended from a top portion of a processing unit that is separated from the bottom portion of said processing unit.
Figure 5:
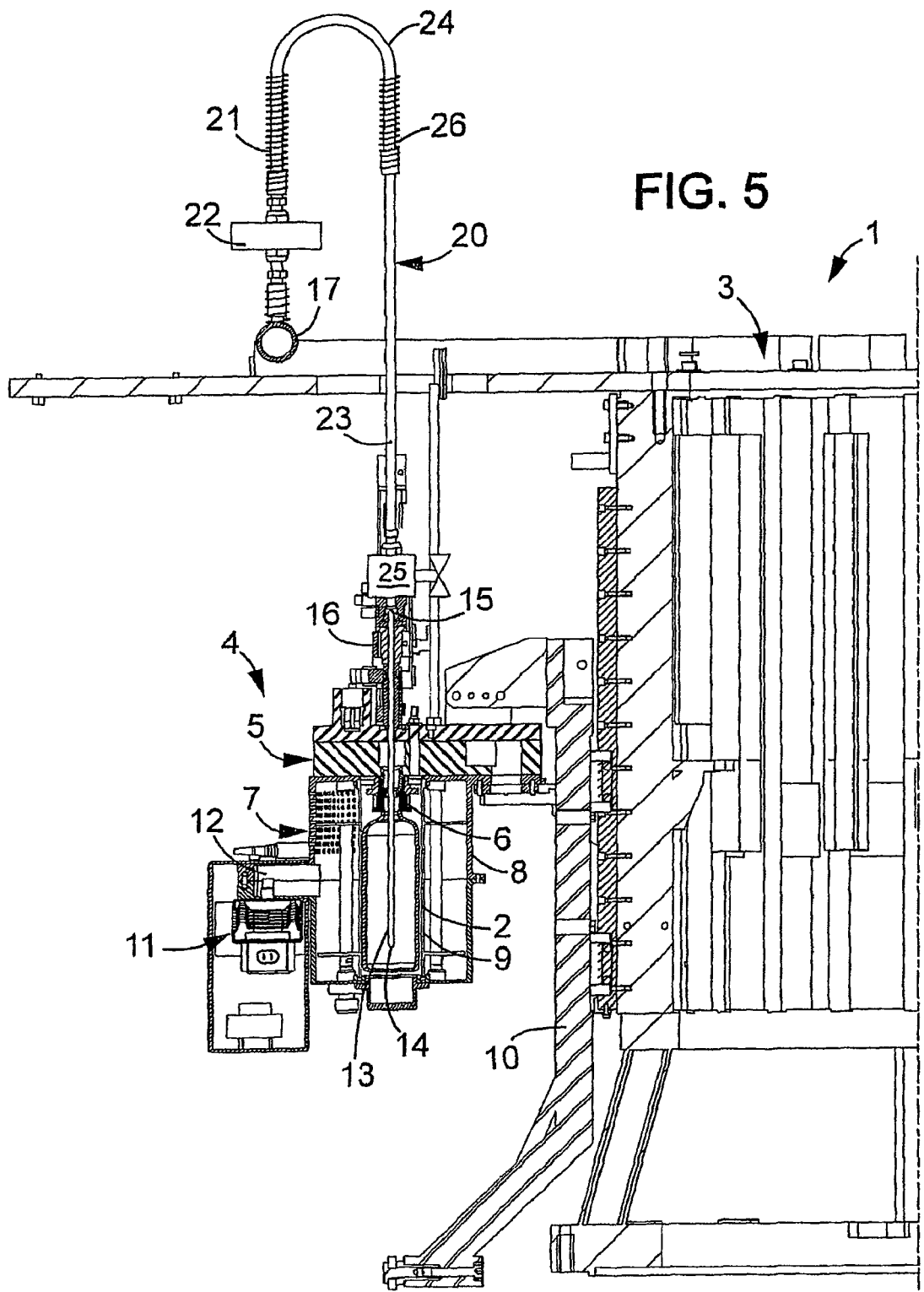
FIG. 5 is a view similar to the FIG. 4 view, showing the machine in a "closed" second position in which the container is received in a cavity formed in a bottom portion of the processing unit.

FIGS. 3 to 5 show a machine 1 for depositing respective thin layers of barrier-effect material by plasma-enhanced chemical vapor deposition (PECVD) on the inside walls of containers 2, such as bottles, one of which is shown in FIGS. 4 and 5.

This machine 1 comprises a carrousel 3, on which a plurality of processing units 4 are mounted, inside each of which the PECVD is performed on a respective container 2.

As shown in FIGS. 4 and 5, each processing unit 4, designed to receive a single container 2, comprises a top portion 5 mounted to move in vertical translation and provided with a support block 6 to which the container 2 is fastened by its neck, as well as a fixed bottom portion 7 that is provided with a metal cavity 8 containing a cylindrical enclosure 9 made of a material transparent to UHF electromagnetic microwaves, e.g. made of quartz. The bottom portion 7 is fastened to the carrousel 3 which is itself mounted to move in rotation about a central axis.

The top portion 5 is fastened to a bracket 10 mounted to move in vertical translation on the carrousel 3, between an open position, shown in FIG. 4, in which the top portion 5 is spaced apart from the bottom portion 7 so as to enable a container 2 to be fastened to the support block 6, and a closed position, shown in FIG. 5, in which the top portion 5 rests in leaktight manner on the bottom portion 7, the container 2 being received in the enclosure 9 for the purpose of being treated.

The processing unit 4 is also equipped with an electromagnetic wave generator 11 connected to the cavity 8 via a waveguide 12, for the purpose of activating the plasma from a precursor gas such as acetylene, decomposition of which causes a thin layer of carbon having a barrier effect to be deposited on the wall of the container 2.

Each processing unit is also provided with a tubular injector 13 which extends along a vertical axis, for the purpose of injecting the precursor gas into the container 2, said injector 13 having a bottom end 14 that opens out into the container 2, and an opposite top end 15. The injector 13 is mounted, via its top end 15, on a support 16 mounted to move in vertical translation relative to the top portion 5, between a high position (FIG. 4) in which the bottom end 14 of the injector 13 is retracted into the support block 6, and a low position (FIG. 5) in which the injector 13 projects from the support block 6 while extending partially into the container 2, over most of the height thereof.

As can be seen in FIG. 3, the machine 1 is also provided with a precursor gas inlet 17 formed by a toroidal manifold pipe connected via connection pipes 18 to a dispenser 19 mounted to move in rotation on the axis of the carrousel 3, the dispenser 19 itself being connected to a precursor gas reservoir (not shown).

Each processing unit is provided with a precursor gas feed duct 20 that puts the precursor gas inlet 17 into fluid flow connection with the top end 15 of the injector 13. Said feed duct 20 comprises an upstream rigid portion 21 vertically projecting from the precursor gas inlet 17 with a regulator flow meter 22 being interposed, and a downstream rigid portion 23 that extends vertically above the injector 13, and that is connected to the upstream rigid portion 21 via a flexible portion 24 that is, for example, supported by a cable-carrying chain not shown in the figures.

As can be seen in FIGS. 4 and 5, the feed duct 20 is connected to the top end 15 of the injector 13 with a solenoid valve 25 being interposed that is described in more detail below.

The feed duct 20 is provided with springs 26 for protecting the flexible portion 24, so as to ensure that the top portion 5 of the processing unit 4 is tracked.

The solenoid valve 25 can take up two configurations, namely:

an open configuration in which it allows the precursor gas to pass through from the feed duct 20 to the injector 13; and a closed configuration in which it prevents the precursor gas from passing through, and prevents air from flowing back up into the duct.

The length of the feed duct 20 between the regulator flow meter 22 and the solenoid valve 25 lies in the range 1 m to 2 m. The solenoid valve 25 is fastened to the support 16 of the injector 13, and is therefore constrained to move in translation therewith relative to the top portion 5 of the processing unit 4.

Operating the machine implements the method that is described below, in particular with reference to FIG. 2.

While the top portion 5 of the processing unit 4 is in the open position, with the solenoid valve 25 and the regulator flow meter 22 closed, a container 2 is fastened by its neck to the support block 6, said container having been formed previously by blowing (or by stretch-blowing) when it is a container made of a plastics material.

The container 2 and the injector 13 are then filled with air, while, with the solenoid valve 25 being closed, the feed duct 20 is filled with precursor gas under pressure (at a relative pressure lying in the range 1 bar to 1.5 bars).

Then the top portion 5 of the processing unit 4 is moved down into the closed position, the container 2 then being received in the enclosure 9.

The container 2 is then put under a partial vacuum (at a pressure of about 0.1 mbar) by means of a vacuum pump (not shown). This step lasts for a time (referenced $t_0$ in FIG. 2) of a few seconds (approximately in the range 1 s to 2 s).

The container 2 is then swept with the precursor gas. To do this, the regulator flow meter 22 and the solenoid valve 25 are opened simultaneously while continuing to apply suction, so as to remove a sufficient amount of air present in the container 2 and so as to put the precursor gas under pressure therein. This step lasts for a time, referenced $t'_1$ in FIG. 2, of a few tenths of a second, in practice lying in the range 0.2 s to 0.3 s.

At the end of this step, the precursor gas is bombarded with UHF microwaves at 2.45 GHz and at low power (a few hundred watts) so as to generate cold plasma with a view to obtaining on the wall of the container 2 an internal barrier layer comprising a hydrogenated amorphous carbon of the PLC type.

Figure 1:
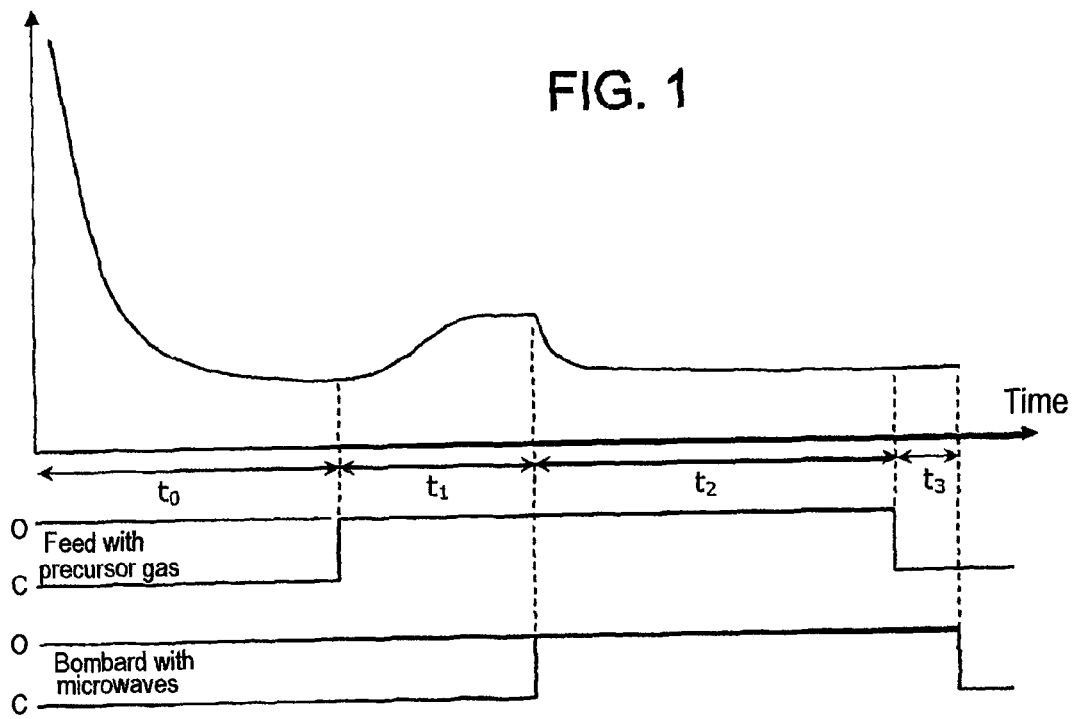
FIG. 1 is a graph showing how pressure varies over time in a conventional PECVD machine.
Figure 2:
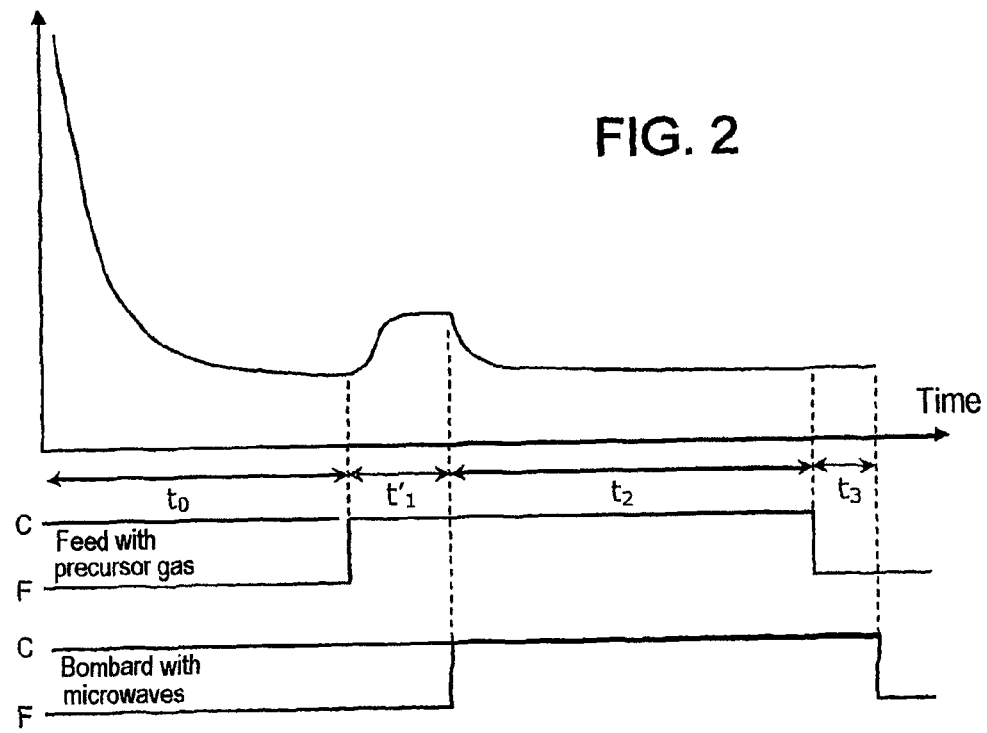
FIG. 2 is a graph similar to the FIG. 1 graph in a machine of the invention.

Feeding with precursor gas is continued for a time, referenced $t_2$ in FIG. 2, lying in the range 1 s to 3 s depending on the thickness of the barrier layer that is to be obtained.

The regulator flow meter 22 and the solenoid valve 25 are then closed simultaneously so as to stop the injection of precursor gas into the container 2. The bombardment with microwaves is continued for a time $t_3$ of about 0.1 s, during which the residual gas coming from the plasma is sucked out.

The processing unit 4 is then opened, the container 2 being removed with a view to it being filled immediately and closed, or to it being stored pending such filling and closure operations.

As explained above, in the preferred implementation, the regulator flow meter 22, like the solenoid valve, has a closure function. Such a function could be omitted, since it is performed by the solenoid valve 25. However, by using the closure function of the regulator flow meter 22, air is excluded from the entire duct downstream from the regulator flow meter and, in the isolated duct, the precursor gas is kept at a constant residual pressure, and is preserved from any pollution.

More precisely, synchronizing the closed position of the solenoid valve with the closed position of the regulator flow meter makes it possible to keep a constant residual pressure inside the duct 20, which pressure, on opening of the solenoid valve 25 and of the regulator flow meter 22, allows the flow of precursor gas to be brought up to speed quickly. The closed position of the solenoid valve also prevents air from entering the duct 20, which could be detrimental to proper deposition of barrier material.

In addition, given the resilience of the feed duct 20 due to the presence of flexible portions, the preferred implementation makes it possible to isolate said feed duct not only from the injector 13 (in order, as explained above, to limit the quantity of residual air to be expelled by the precursor gas), but also from the precursor gas inlet 17, so as to avoid the feed duct 20 deforming under the pressure of the gas.

The invention claimed is:

1. A machine for depositing a thin layer of a barrier-effect material on an inside wall of a container by Plasma-Enhanced Chemical Vapor Deposition (PECVD), said machine comprising:
   a processing unit receiving the container and equipped with an electromagnetic wave generator for activating the plasma from a precursor gas;
   a precursor gas inlet;
   an injector for injecting said precursor gas into the container, said injector having a bottom end that opens out into the container and an opposite top end; and
   a precursor gas feed duct that puts the precursor gas outlet into fluid flow connection with the top end of the injector;
   wherein said machine further comprises:
   a solenoid valve interposed in the feed duct between the precursor gas outlet and the injector, immediately upstream from the top end of the injector, said solenoid valve having an open configuration in which it allows the precursor gas to pass through from the feed duct to the injector, and a closed configuration in which it prevents the precursor gas from passing through; and
   a pressure regulator flow meter interposed between the feed duct and the precursor gas outlet, the pressure regulator flow meter being arranged to operate in synchronization with the solenoid valve so that, when the solenoid valve is in its open configuration, said valve allows the precursor gas to flow through from the feed duct (20) via the regulator flow meter to the injector, and, when said solenoid valve is in its closed configuration, said valve prevents the precursor gas from flowing through.

2. A machine according to claim 1, wherein the injector is mounted at its top end on a moving support to which said solenoid valve is fastened.

3. A machine according to claim 2, wherein said moving support is mounted on a top portion of the processing unit to move in translation between an open position in which it is spaced apart from a bottom portion including an enclosure suitable for receiving the container, and a closed position in which it rests in leaktight manner on said bottom portion.

4. A method of depositing a thin layer of a barrier-effect material on an inside wall of a container by plasma-enhanced chemical vapor deposition (PECVD), said method implementing a machine according to claim 1, and said method comprising the following steps:
   inserting the previously formed container into the processing unit, the solenoid valve being in its closed configuration;
   putting the container under a partial vacuum by evacuation by applying suction;
   simultaneously opening a regulator flow meter and the solenoid valve while continuing to apply suction so as to remove a sufficient amount of the air present in the container and so as to put the precursor gas under pressure therein;
   sweeping the container with the precursor gas;
   bombarding the precursor gas with electromagnetic microwaves so as to activate the plasma;
   after the barrier layer has formed, simultaneously closing the regulator flow meter and the solenoid valve so as to stop injecting precursor gas into the container;
   ceasing the bombardment; and
   sucking out the residual gases coming from the plasma.

5. A method of performing plasma deposition according to claim 4, wherein, after the regulator flow meter and the solenoid valve have been closed, the bombardment with microwaves is continued for the step of sucking out the residual gases coming from the plasma.

* * * * *